(12) United States Patent
Lin et al.

(10) Patent No.: US 7,772,885 B1
(45) Date of Patent: Aug. 10, 2010

(54) LEVEL SHIFTER CIRCUIT TO SHIFT SIGNALS FROM A LOGIC VOLTAGE TO AN INPUT/OUTPUT VOLTAGE

(75) Inventors: Hwong-Kwo Lin, Palo Alto, CA (US);
Ge Yang, Pleasanton, CA (US);
Guoqing Ning, Santa Clara, CA (US);
Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 12/467,112

(22) Filed: May 15, 2009

(51) Int. Cl.
*H03K 19/0175* (2006.01)
(52) U.S. Cl. .............................. 326/68; 326/81; 327/333
(58) Field of Classification Search .................... 326/68, 326/80–81, 33; 327/133, 540, 541, 543
See application file for complete search history.

(56) References Cited

U.S. PATENT DOCUMENTS

| | | | |
|---|---|---|---|
| 6,535,019 B2 * | 3/2003 | De Santis | 326/83 |
| 6,639,427 B2 * | 10/2003 | Dray et al. | 326/83 |
| 7,463,065 B1 * | 12/2008 | Lin et al. | 326/68 |

* cited by examiner

*Primary Examiner*—James Cho
(74) *Attorney, Agent, or Firm*—Patterson & Sheridan, LLP

(57) ABSTRACT

One embodiment of the present invention sets forth a technique for shifting the voltage level of signals from the high voltage domain to a low voltage domain, where VDD_IO is the supply voltage of the high voltage domain and VDD_Logic is the supply voltage of the low voltage domain. A level shifting circuit using a combination of I/O and logic transistors avoids exceeding a maximum tolerable voltage across the gate and source of any of the transistors. The level shifting circuit operates includes a reference voltage circuit that is independent of VDD_IO, so the same level shifting circuit may be used for various VDD_IO voltages. Additionally, the voltage level shifting circuit is not sensitive to scaling of VDD_Logic and operates properly when VDD_Logic is reduced due to shrinking silicon process technology and/or is reduced for a low power application.

20 Claims, 11 Drawing Sheets

PRIOR ART

PRIOR ART

LEVEL SHIFTER CIRCUIT TO SHIFT SIGNALS FROM A LOGIC VOLTAGE TO AN INPUT/OUTPUT VOLTAGE

BACKGROUND OF THE INVENTION

1. Field of the Invention

The present invention generally relates to digital input/output circuits and more specifically to a level shifter circuit to shift signals from a logic voltage to an input/output voltage.

2. Description of the Related Art

Conventional integrated circuit devices use different voltage levels for input/output (I/O) circuitry and logic circuitry. The I/O circuitry interfaces with other devices in a system and typically uses a higher voltage, e.g., 3.3 or 2.5 volts, compared with the logic circuitry. As the logic circuitry scales down in size to use the newer silicon technologies, the voltage level used for the logic circuitry is reduced. For example a 90 nanometer silicon process may use a 1.2 volt supply and a 65 nanometer silicon process may use a 1 volt supply. As the difference in voltage levels between the I/O circuitry and logic circuitry increases, the difficulty of shifting the voltage level of signals from the logic domain to the I/O domain is increased.

FIG. 1 illustrates a level shifter circuit 100 configured to shift signals from a VDD_Logic voltage level to a VDD_IO voltage level, according to the prior art. Circuit 100 includes two PMOS transistors, 115 and 135 and two NMOS transistors, 110 and 130. Transistors 115, 110, 135, and 130 are all designed to operate at VDD_IO, i.e., are input/output devices. Inverter 132 is also designed to operate at VDD_IO. Inverters 122 and 127 are designed to operate at VDD_Logic, i.e., are logic devices, so that the gate oxide is reliable up to a maximum voltage across the gate and source (gate to source voltage or Vgs) of approximately VDD_Logic*1.2.

VDD 125 is set to VDD_IO and ground 220 is set to the ground voltage of 0 volts. The input 105 ranges between ground and VDD_Logic and the output 150 should range between ground and VDD_IO. When a VDD_Logic of 1.2 volts is applied to input 105, the output of inverter 122 is discharged to ground and the output of inverter 127 is pulled up to VDD_Logic. Transistors 115 and 130 are activated and the input to inverter 132 is discharged to ground while output 150 is pulled up to VDD_IO (assuming VDD_Logic is greater than the threshold voltage, Vth of the input/output devices).

When input 105 transitions to ground, the output of inverter 122 is pulled up to VDD_Logic and the output of inverter 127 is discharged to ground. Transistors 135 and 110 are activated and the input to inverter 132 is pulled up to VDD_IO while output 150 is discharged to ground (assuming VDD_Logic is greater than the threshold voltage, Vth_IO of the input/output devices).

However, when a silicon process is used that allows the size of logic circuitry to be reduced to use a VDD_Logic of 0.9 volts, such as a 45 nanometer process, circuit 100 may not function properly. Also, when circuit 100 is configured to use a VDD_logic of 0.8 volts for a low power application, the circuit 100 may not function properly. When VDD_logic is equal or less than Vth_IO, transistors 110 and 130 to be only weakly activated or not activated and unable to discharge the gate of transistor 135 or 115, respectively. As a result, the input of inverter 132 may not be discharged to drive output 150 to VDD_IO, causing the output 150 to be unknown.

Replacing transistors 110 and 130 with transistors configured to operate at logic levels solves the VDD_Logic scaling down problem. However, a gate oxide reliability problem is created. Assuming a VDD_Logic of 1.0 volts, the maximum tolerable Vgs (or Vds) of the logic transistor is VDD_logic*1.2=1.2 volts. When input 105 is at VDD_Logic, the output of inverter 122 is discharged to ground and the gate of transistor 135 is at VDD_IO. The Vgs of the logic transistor (replacing input/output transistor 110) is VDD_IO. When VDD_IO exceeds the maximum tolerable Vgs of 1.2 volts, the gate oxide of the logic transistor is compromised and breaks down over time, impairing proper operation of the circuit.

A voltage reference may be used to avoid the gate oxide reliability problem and the VDD_Logic scaling problem. FIG. 2 illustrates a level shifter circuit 200, configured to shift signals from a VDD_Logic voltage level to a VDD_IO voltage level using a voltage reference, according to the prior art. Circuit 200 includes two PMOS transistors, 215 and 235 and four NMOS transistors, 240, 245, 210, and 230. Transistors 215, 235, 240, and 245 and inverter 232 are input/output devices that are designed to operate at VDD_IO. Transistors 210 and 230 and inverters 222 and 227 are logic devices that are designed to operate at VDD_Logic. VDD_IO 225 is set to VDD_IO and ground 220 is set to the ground voltage of 0 volts. Input 205 ranges between ground and VDD_Logic and output 250 should range between ground and VDD_IO.

Circuit 200 also includes a voltage reference, Vref 207 that equals $VDD\_IO*R2/(R1+R2)$, where R2 is the resistance of 202 and R1 is the resistance of 201. When input 205 is at VDD_Logic, the output of inverter 222 is at ground. Assuming that the maximum allowable Vgs at node 242 is Vc_max, the maximum $Vref=Vc\_max+Vth\_IO$, where Vth_IO is the threshold voltage of an input/output transistor. In order to activate input/output transistors 240 and 245, and maintain adequate overdrive (Vgs−Vth), the minimum $Vref=Vth\_IO+0.3$ volts. Therefore, Vc_max should be greater than $VDD\_IO*R2/(R1+R2)-Vth\_IO$. The values of R1 and R2 are determined for each different VDD_IO. For example, when VDD_IO is 3.3 volts, VDD_Logic is 1.0 volts, Vth_IO is 0.9 volts, Vc_max is 1.2 volts, R1 equals R2, and Vref is 1.65 volts. The voltage at node 242 is 1.65−0.9=0.75 volts. If VDD_IO is changed t 1.8 volts, Vref is 0.9 volts and transistors 240 and 245 cannot be activated.

Accordingly, what is needed in the art is a system and method for shifting the voltage level of signals from the logic domain to the I/O domain that is independent of VDD_IO and operates as the logic circuitry size changes.

SUMMARY OF THE INVENTION

Various embodiments of the invention comprise a voltage level shifter circuit for shifting an input signal from a low voltage domain that uses a low voltage supply to a high voltage domain that uses a high voltage supply. The voltage level shifter circuit includes a reference voltage circuit configured to produce a reference voltage signal and a circuit configured to receive the input signal from the low voltage domain and the reference voltage signal and produce an output signal that equals the high voltage supply when the low voltage supply is applied to the input signal and equals a ground when the ground is applied to the input signal. The reference voltage signal that is independent of the high voltage supply and ranges in value between a minimum voltage value and a maximum voltage value. The minimum voltage value is equal to the sum of a low voltage supply of the low voltage domain and a threshold voltage of a transistor configured to operate in the high voltage domain and the maximum voltage value is equal to the difference between the high voltage supply and the threshold voltage of the transistor configured to operate in the high voltage domain.

One advantage of the disclosed voltage level shifting circuit is that it uses a combination of I/O and logic transistors to avoid exceeding a maximum tolerable voltage across the gate and source of any of the transistors. Therefore, the voltage level shifting circuit is not sensitive to scaling of the low voltage supply and operates properly when the low voltage supply is reduced due to shrinking silicon process technology and/or is reduced for a low power application. The voltage level shifting circuit also uses a voltage reference circuit that is independent of the high voltage supply. These qualities allow enable fabrication of voltage level shifter circuit across various silicon process technologies and for different high voltage supply and low voltage supply values.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
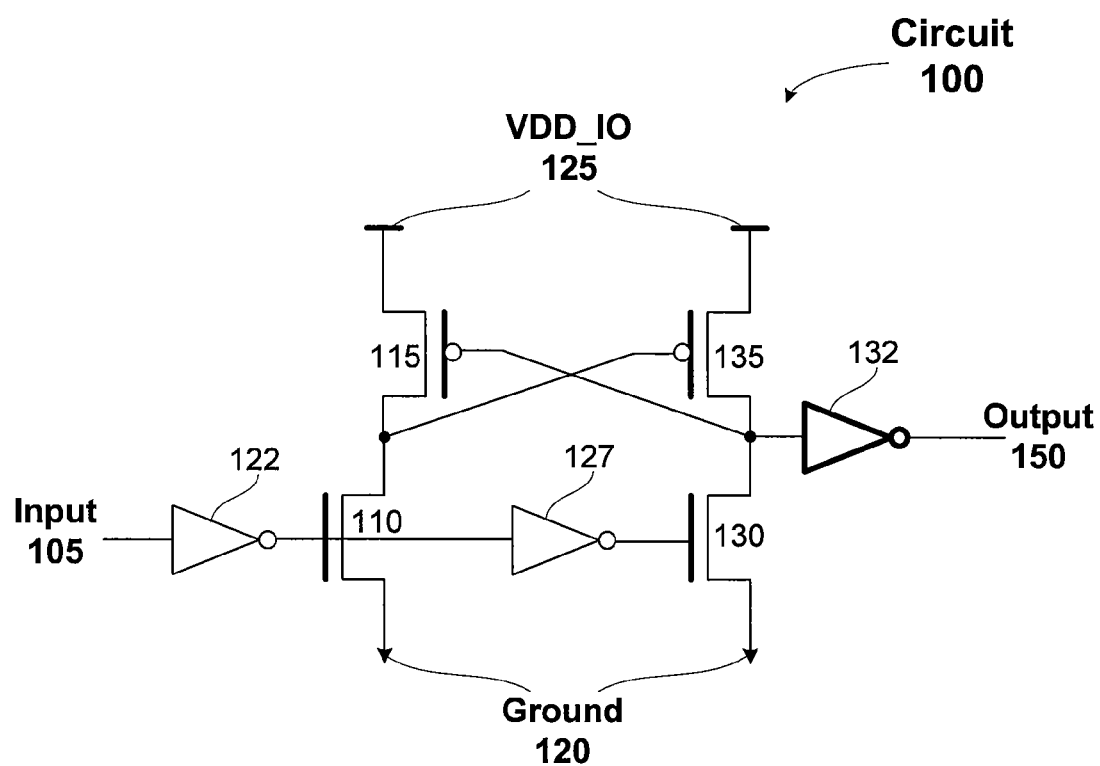
FIG. 1 illustrates a level shifter circuit, according to the prior art.
Figure 2:
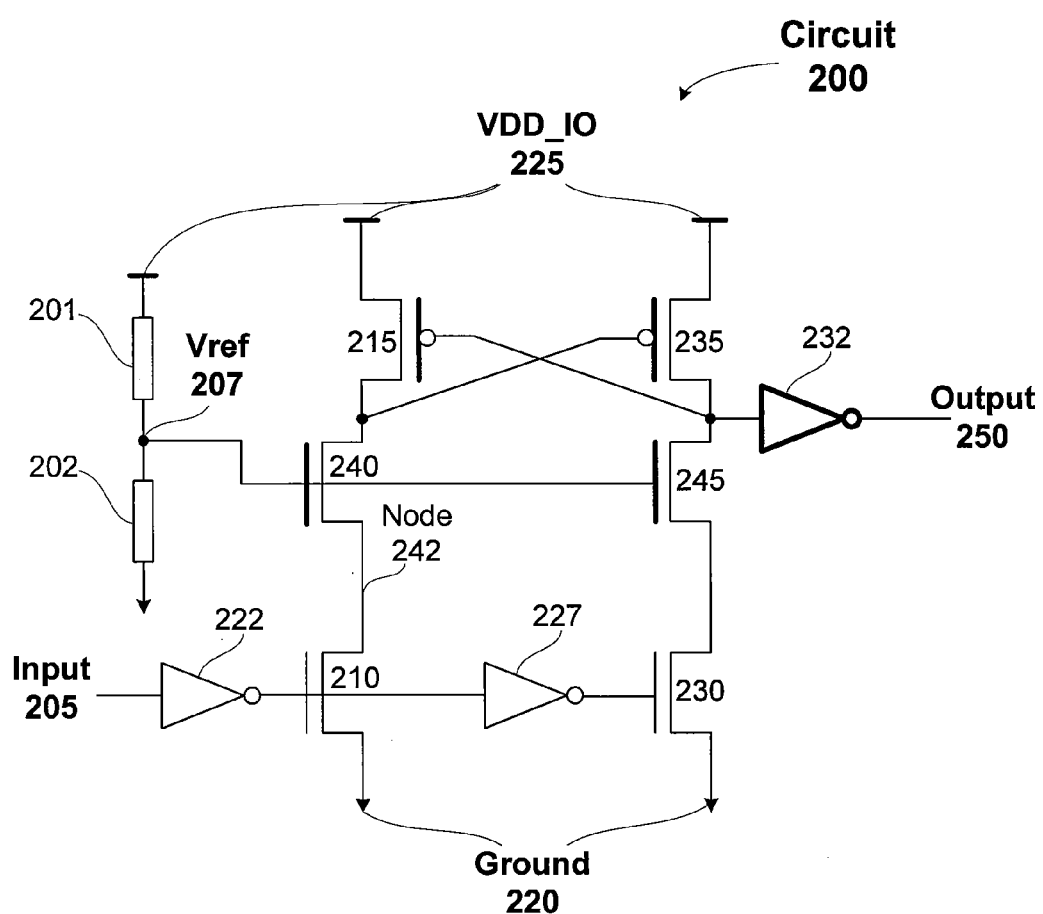
FIG. 2 illustrates another level shifter circuit, according to the prior art.
Figure 3:
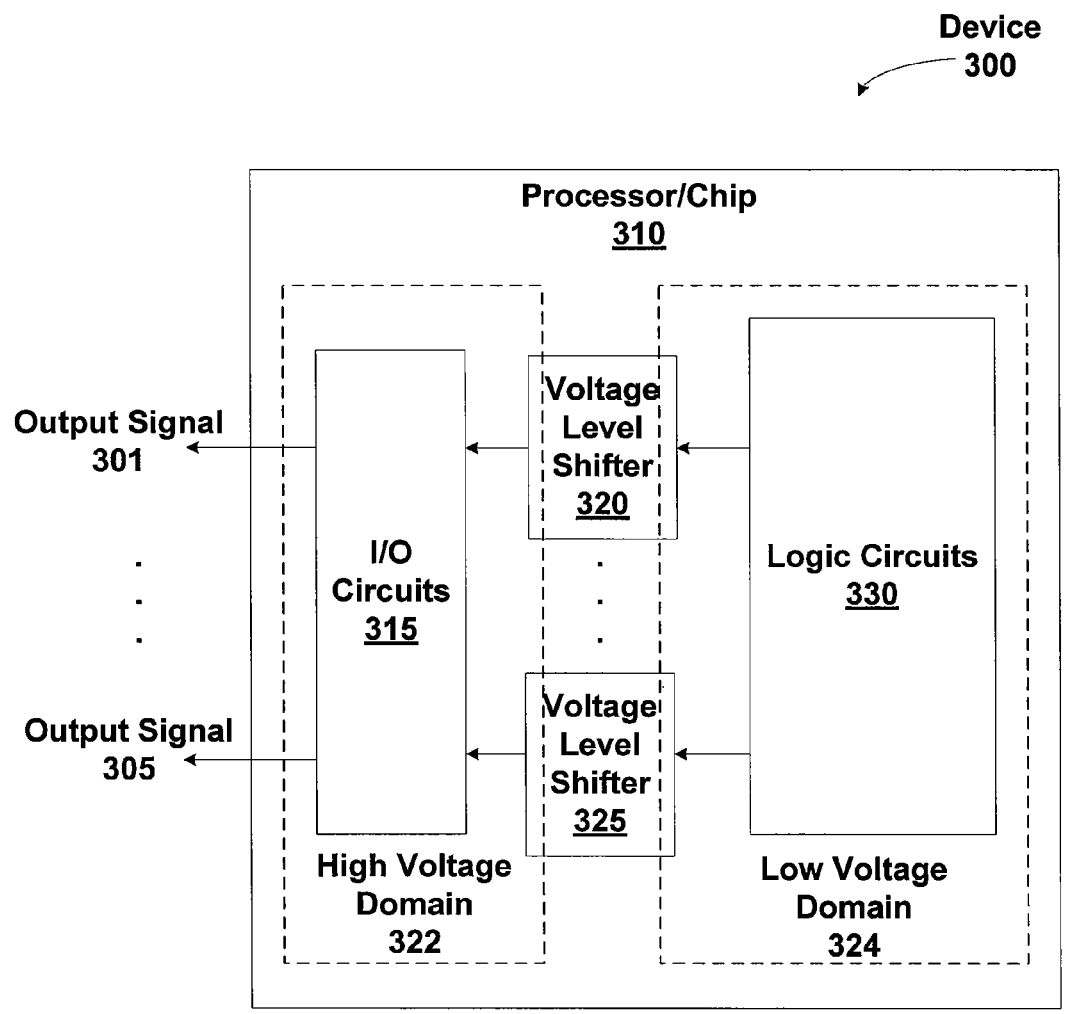
FIG. 3 is a block diagram illustrating a processor/chip with a voltage level shifter configured to implement one or more aspects of the present invention.

FIG. 3 is a block diagram illustrating a device 300 that includes a voltage level shifter 320 configured to implement one or more aspects of the present invention. Logic circuits 330 is within a low voltage domain 324 and operates at a VDD_logic voltage level that is lower than the VDD_IO voltage level used by I/O circuits 315. I/O circuits 315 is within a high voltage domain 322 and may include pads and other I/O specific circuits that operate at the VDD_IO voltage to send and receive signals from other devices in a system that also operate at the VDD_IO voltage. Output signals 301 through 305 are produced by I/O circuits 315 based on signals received by voltage level shifters 320 and 325 from the low voltage domain 324.

Voltage level shifters 320 and 325 are within both the high voltage domain 322 and the low voltage domain 324 and shift the signals from the VDD_Logic voltage used in the low voltage domain 324 to the VDD_IO voltage level used in the high voltage domain 322 to produce output signals 301 through 305. Voltage level shifters are described in detail in conjunction with FIGS. 4B, 4C, 4D, 4E, 5A, and 5B. Although voltage level shifters 320 and 325 are shown in FIG. 3 as shifting signals from the low voltage domain 324 to the high voltage domain 322, the voltage level shifters 320 and 325 may also be used to shift signals from any circuitry operating at a voltage that is lower than the VDD_IO voltage to the high voltage domain 322. In other words, the voltage level shifters 320 and 325 are configured to shift signals from a low voltage domain to a high voltage domain, where the high voltage domain operates using a voltage supply that is at a higher voltage compared with the voltage supply used by devices in the low voltage domain.

Figure 4A:
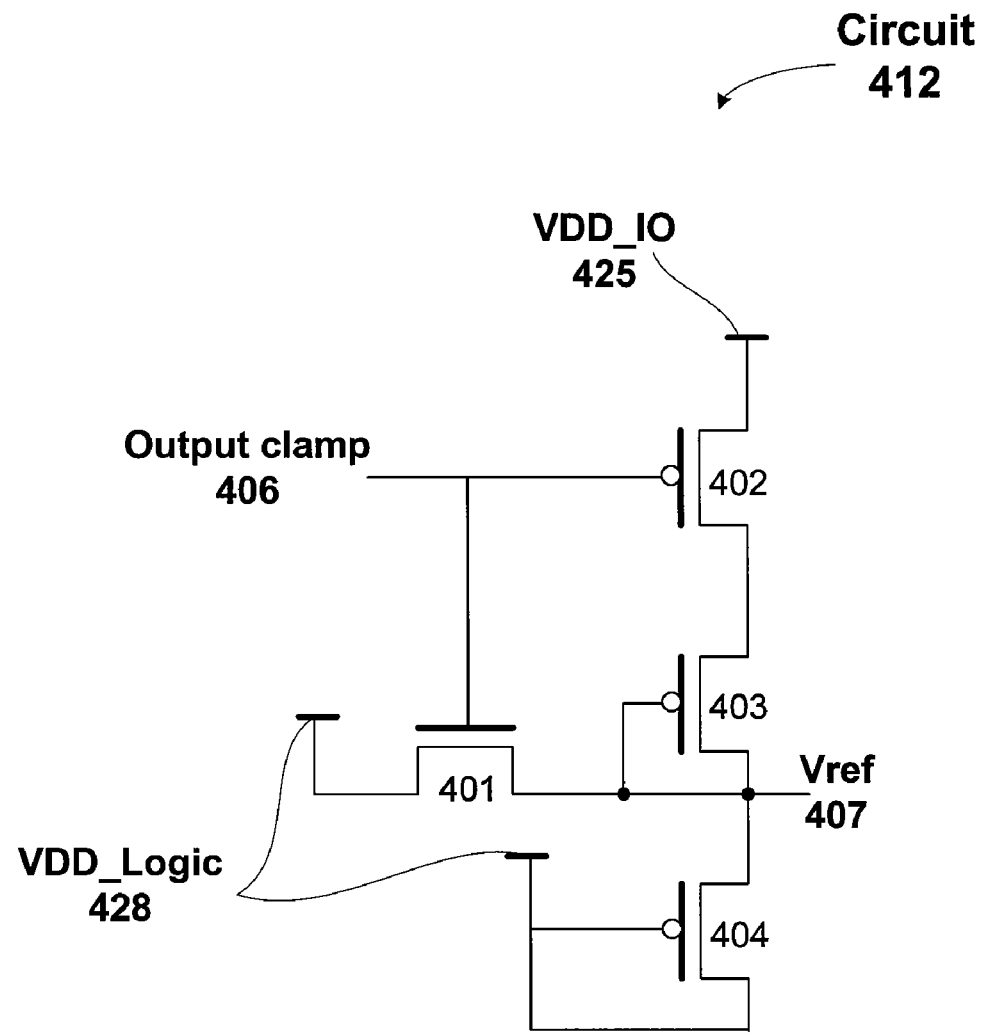
FIG. 4A illustrates a voltage reference circuit that is independent of VDD_IO, according to one embodiment of the invention.

FIG. 4A illustrates a voltage reference circuit 412 that is independent of the high voltage domain supply, VDD_IO 425, according to one embodiment of the invention. Transistors 401, 404, 403, and 402 are all input/output devices that are designed to operate at VDD_IO 425. Output clamp 406 is the output clamp input. Voltage reference circuit 412 is configured in an operation mode when ground is applied to output clamp 406 and voltage reference circuit 412 is configured in a clamp mode when VDD_IO is applied to output claim 406. When voltage reference circuit 412 is in operation mode, transistor 402 is activated and transistor 404 is activated when Vref 407 is greater than or equal to the sum of VDD_Logic 428 and the threshold voltage of the input/output transistors, Vth_IO. Transistor 403 is activated when Vref 407 is less than or equal to the difference between VDD_IO 425 and Vth_IO. Therefore, Vref 407 ranges in value between VDD_Logic+ Vth_IO and VDD_IO−Vth_IO.

Transistors 404 and 403 may be sized such that the width of transistor 403 is less than the width of transistor 404, resulting in transistor 404 having a smaller resistance compared with transistor 403 and Vref 407 that approximately equals VDD_Logic+Vth_IO when voltage reference circuit 412 is configured in the operation mode. When voltage reference circuit 412 is configured in the clamp mode, Vref 407 equals VDD_Logic. Importantly, Vref 407 is independent of the high voltage domain supply, VDD_IO 425, and operates as the logic circuitry size changes.

Figure 4B:
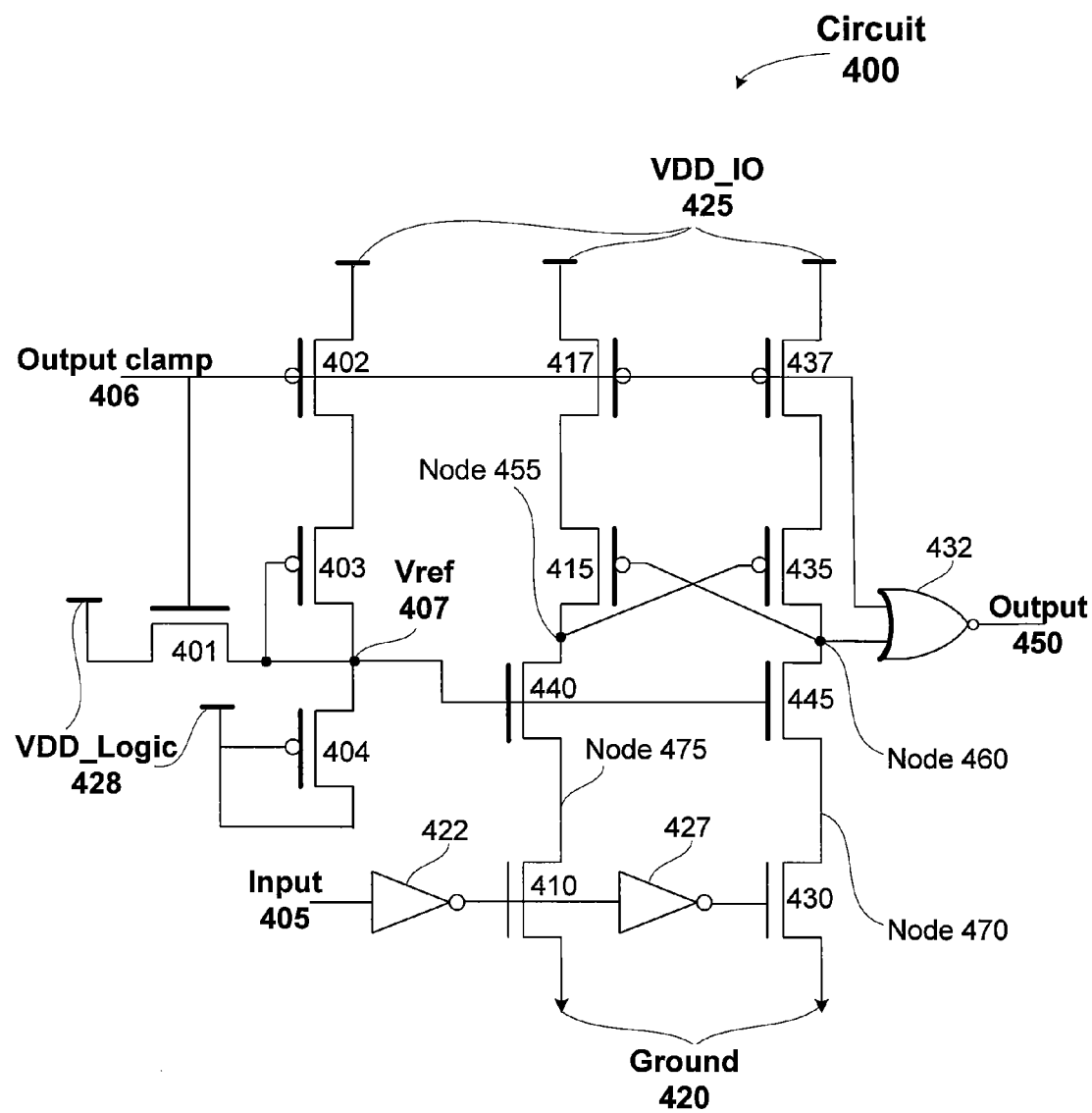
FIG. 4B illustrates a level shifter circuit for shifting signals from a logic voltage to an input/output voltage, according to one embodiment of the invention.

FIG. 4B illustrates a level shifter circuit 400 for shifting signals from a low voltage domain to high voltage domain, according to one embodiment of the invention. Input signal 405 is level shifted from a VDD_Logic voltage to a VDD_IO voltage, producing an output signal 450. Unlike circuits 100 and 200, voltage level shifter circuit 400 is not sensitive to VDD_Logic scaling or transistor failure due to gate oxide reliability. Level shifter circuit 400 functions properly using Vref 407 that is independent of VDD_IO 425. Transistors 401, 402, 403, and 404 are configured to form the voltage reference circuit 412. Inverters 422 and 427 and transistors 410 and 430 are the only logic devices in level shifter circuit 400. The gates of PMOS I/O transistors 402, 417, and 437 and a first input to a NOR gate 432 are coupled to the output clamp 406 signal. The gate of NMOS I/O transistor 401 is also coupled to the output clamp 406 signal.

Input 405 is received by a first inverter 422 whose output is coupled to the gate of NMOS transistor 410 and the input of a second inverter 427. The output of the second inverter 427 is coupled to the gate of NMOS transistor 430. The source of NMOS transistor 430 is coupled to the drain of NMOS transistor 445 at node 470. The source of NMOS transistor 410 is coupled to the drain of NMOS transistor 440 at node 475. The gates of transistors 440 and 445 are coupled to Vref 407. PMOS transistor 415 is coupled between transistors 417 and 440 and has a gate coupled to the second input of the NOR gate 432 at node 460. PMOS transistor 435 is coupled between transistors 437 and 445 and has a gate coupled to a node 455. Output 450 is generated by the NOR gate 432 as the voltage level shifted input 405. VDD_IO 425 is the voltage supply of the high voltage domain, VDD_Logic 428 is the voltage supply of the low voltage domain, and ground 420 equals the ground voltage.

When output clamp 406 is at ground voltage level shifter circuit 400 is configured in the operation mode. Vref 407 equals VDD_Logic+Vth_IO and the voltages at nodes 475 and 470 is Vref−Vth_IO=VDD_Logic. Since the maximum tolerable voltage at nodes 475 and 470 is approximately 1.2*VDD_Logic, transistors 410 and 430 will not have gate reliability issues. The only variable is VDD_Logic which may change due to shrinking silicon process technology and/ or be reduced for a low power application.

Figure 4C:
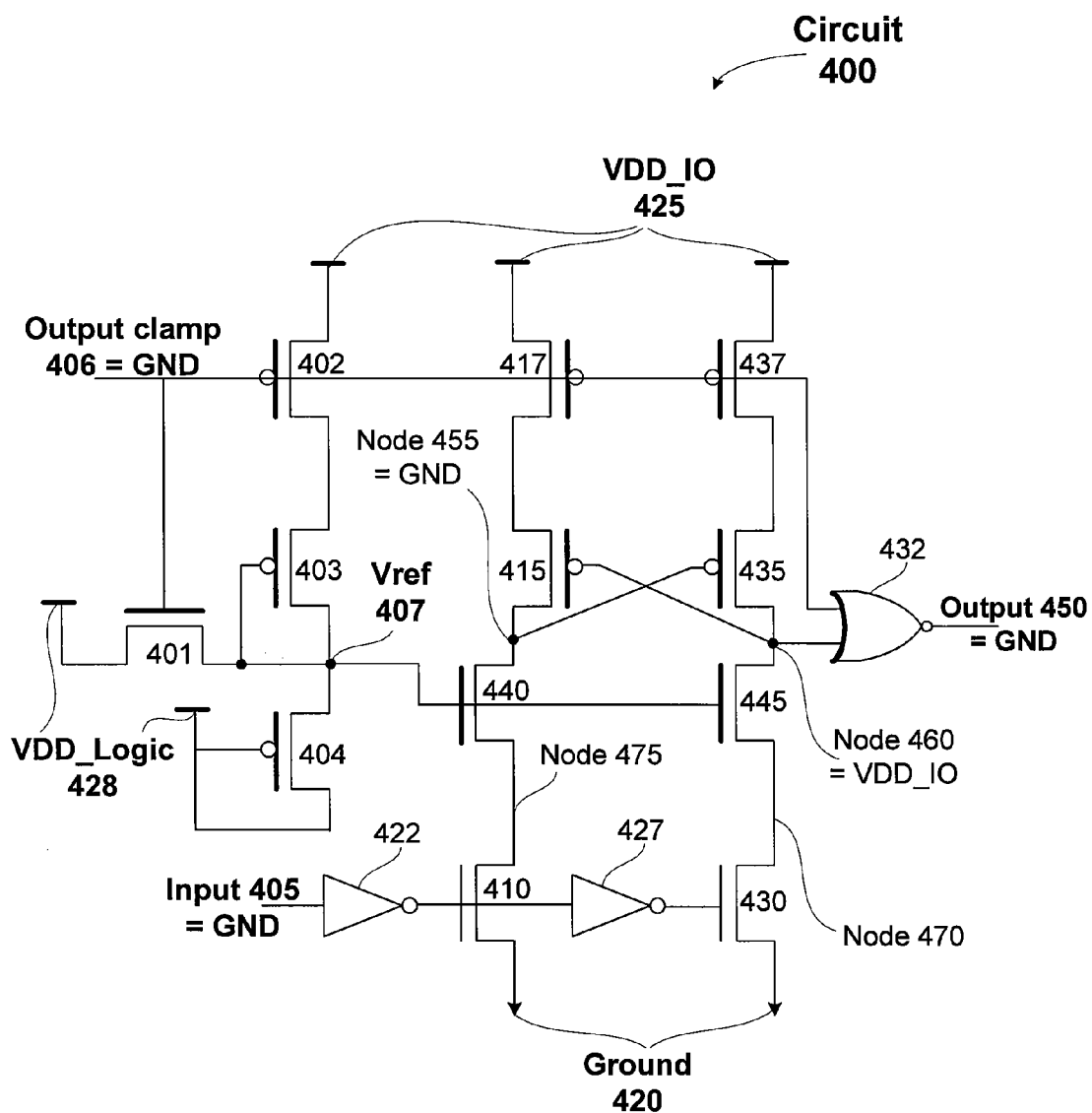
FIG. 4C illustrates the level shifter circuit of FIG. 4B when a ground is applied to the input, in accordance with one or more aspects of the present invention.

FIG. 4C illustrates the level shifter circuit 400 of FIG. 4B when ground is applied to the input 405, in accordance with one or more aspects of the present invention. Ground is also applied to output clamp 406 to configure voltage level shifter 400 in operation mode by activating transistors 402, 417 and 437 and disabling transistor 401. Vref 407 equals VDD_Logic+Vth_IO. The output of inverter 422 is VDD_Logic and the output of inverter 427 is discharged to ground, disabling transistor 430. Transistors 410 and 440 are activated and nodes 475 and 455 are discharged to ground.

As node 455 is discharged to ground, transistor 435 is activated and node 460 is pulled up to VDD_IO and transistor 415 is turned off. As node 460 is pulled up to VDD_IO, transistor 445 is activated and node 470 is pulled up from ground to Vref−Vth_IO=VDD_Logic. Output 450 is discharged to ground as the second input (node 460) is pulled up to VDD_IO. The critical timing path is from input 405 through inverter 422, through transistors 410 and 440 to discharge node 455 to ground and pull up the second input to the NOR gate 432 through transistors 437 and 435 and discharge output 450.

Figure 4D:
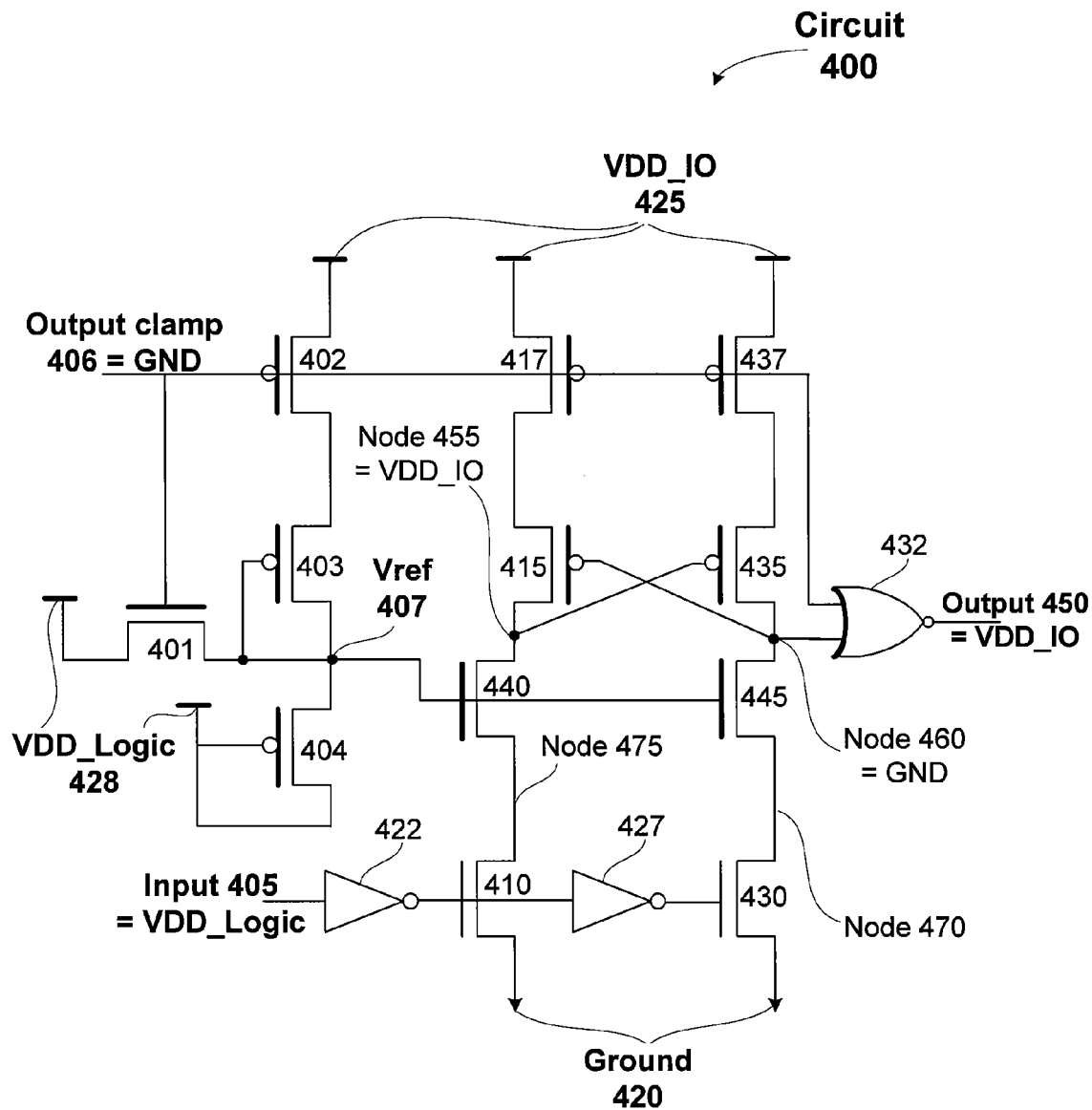
FIG. 4D illustrates the level shifter circuit of FIG. 4B when a logic voltage is applied to the input, in accordance with one or more aspects of the present invention.

FIG. 4D illustrates the voltage level shifter circuit 400 of FIG. 4B when a logic voltage, VDD_Logic is applied to the input 405, in accordance with one or more aspects of the present invention. Ground is applied to output clamp 406 to configure voltage level shifter 400 in the operation mode by activating transistors 402, 417 and 437 and disabling transistor 401. Vref 407 equals VDD_Logic+Vth_IO. The output of inverter 422 is discharged to ground, turning off transistor 410. The output of inverter 427 is pulled up to VDD_Logic, activating transistor 430 and discharging node 470 to ground. Transistor 445 is activated and node 460 is discharged to ground.

As node 460 is discharged, transistor 415 is activated and node 455 is pulled up to VDD_IO, turning off transistor 435. As node 455 is pulled up to VDD_IO, transistor 440 is activated and node 475 is pulled up from ground to Vref−Vth_IO=VDD_Logic. Output 450 is pulled up to VDD_IO as the second input (node 460) is discharged to ground. The critical timing path is from input 405 through inverter 422, transistor 410, and inverter 427, through transistors 430 and 445 to discharge node 460 to ground and pull up output 450 through NOR gate 432.

Figure 4E:
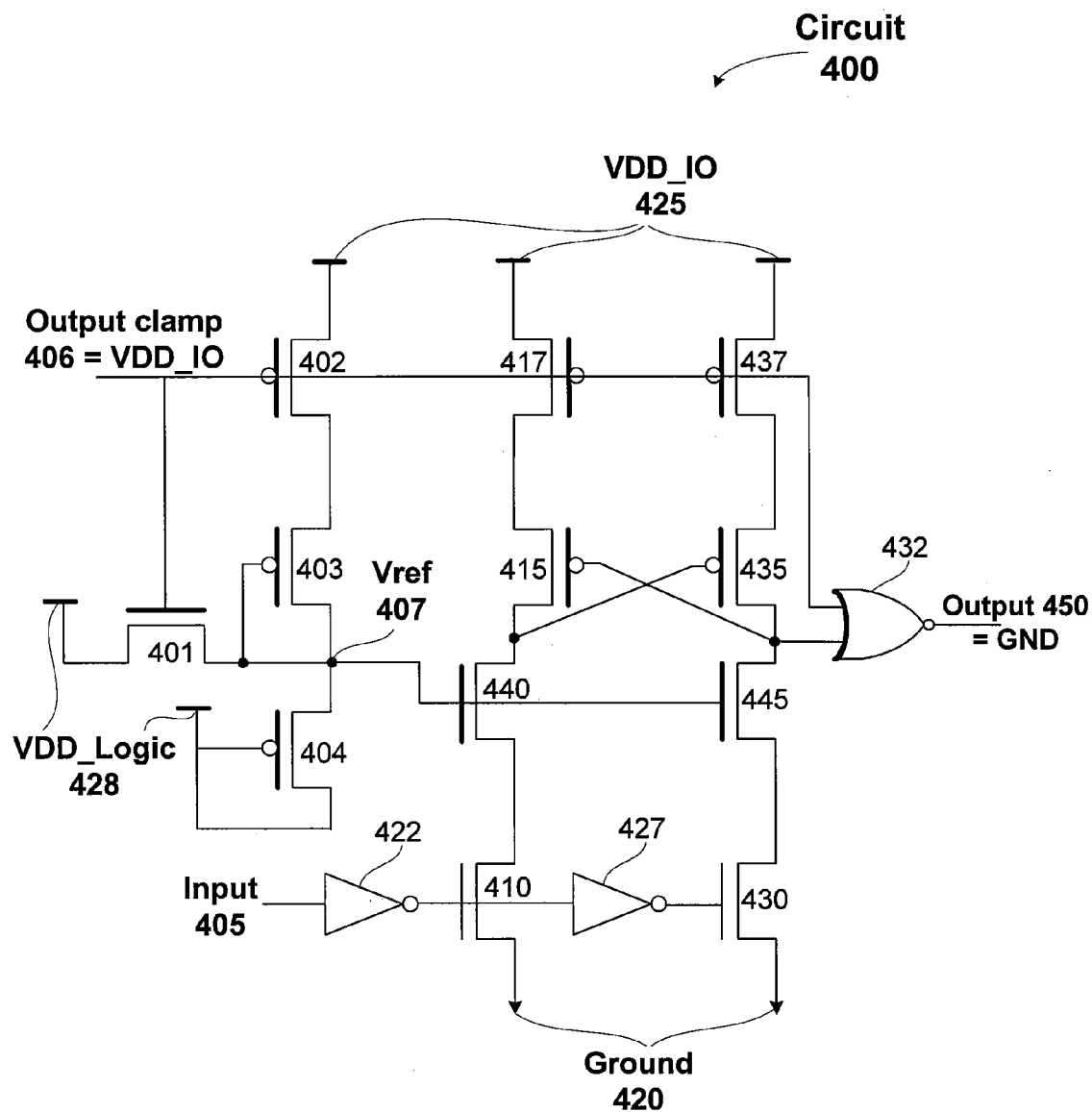
FIG. 4E illustrates the level shifter circuit of FIG. 4B when output clamp signal is asserted, in accordance with one or more aspects of the present invention.

FIG. 4E illustrates the voltage level shifter circuit 400 of FIG. 4B when output clamp 406 is asserted and voltage level shifter circuit 400 is configured in the clamp mode, in accordance with one or more aspects of the present invention. VDD_IO is applied to output clamp 406 and transistors 402, 417, and 437 are turned off, disabling all possible current paths from VDD_IO to ground or VDD_Logic. Transistor 401 is activated and Vref 407 is VDD_Logic (assuming VDD_IO−Vth_IO>VDD_Logic). As VDD_IO is applied to output clamp 406, the first input to the NOR gate 432 is pulled up to VDD_IO and output 450 is discharged to ground. The critical timing path is from output clamp 406 through NOR gate 432 to discharge output 450 to ground.

Figure 5A:
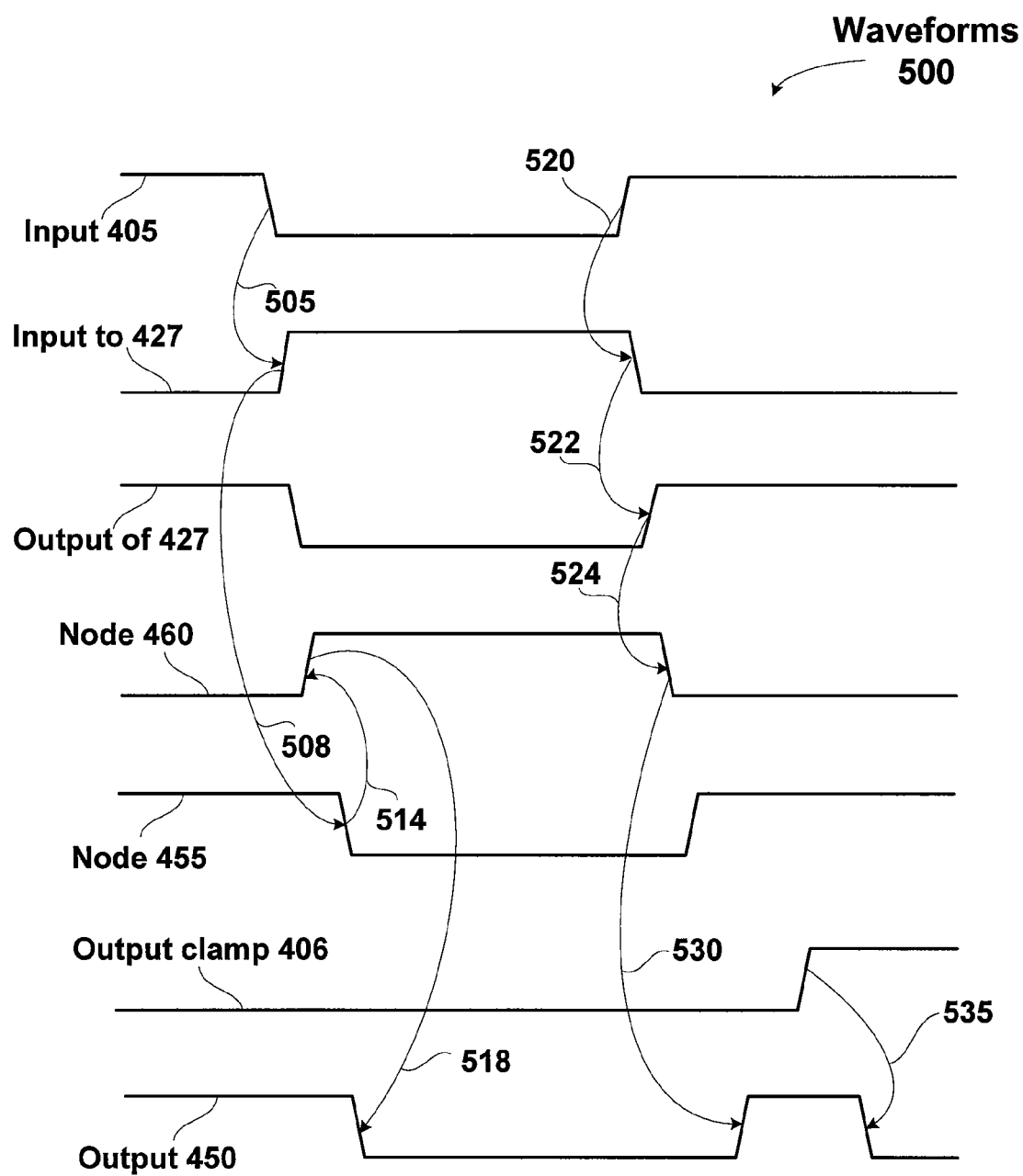
FIG. 5A is a signal diagram showing waveforms of the level shifter circuit for shifting signals from a logic voltage to an input/output voltage, according to one embodiment of the invention.

FIG. 5A is a signal diagram showing waveforms of the voltage level shifter circuit 400, according to one embodiment of the invention. Input 405 is initially at the VDD_Logic voltage, the input to inverter 427 is at ground and the output of inverter 427 is at VDD_Logic. Nodes 460 and 470 are at ground and nodes 455 and 475 are at VDD_IO. Output clamp 406 is at ground, output 450 is at VDD_IO and Vref 407 is at VDD_Logic+Vth_IO.

Input 405 transitions from the VDD_Logic voltage to the ground voltage. In response, arrow 505 indicates that the input to inverter 427 is pulled up to VDD_Logic. In response, arrow 508 indicates that node 455 transitions from VDD_Logic to the ground voltage. In response to the node 455 transitioning, arrow 514 indicates that that the node 460 is pulled up to VDD_IO causing output 450 to transition from the VDD_IO voltage to the ground voltage.

At a later point in time, input 405 transitions from the ground voltage to the VDD_Logic voltage. In response, arrow 520 indicates that the input to inverter 427 transitions from VDD_Logic to the ground voltage. The output of inverter 427 is pulled up to VDD_Logic, as indicated by arrow 522. In response, arrow 524 indicates that the node 460 is discharged from VDD_IO to the ground voltage. In response to node 460 transitioning, arrow 530 indicates that the output 450 transitions from the ground voltage to the VDD_IO voltage.

At a later point in time, output clamp 406 transitions from the ground voltage to the VDD_IO voltage. In response, arrow 520 indicates that the output 450 transitions from the VDD_IO voltage to the ground voltage. The Vref 407 transitions from VDD_Logic+Vth_IO to VDD_Logic.

Figure 5B:
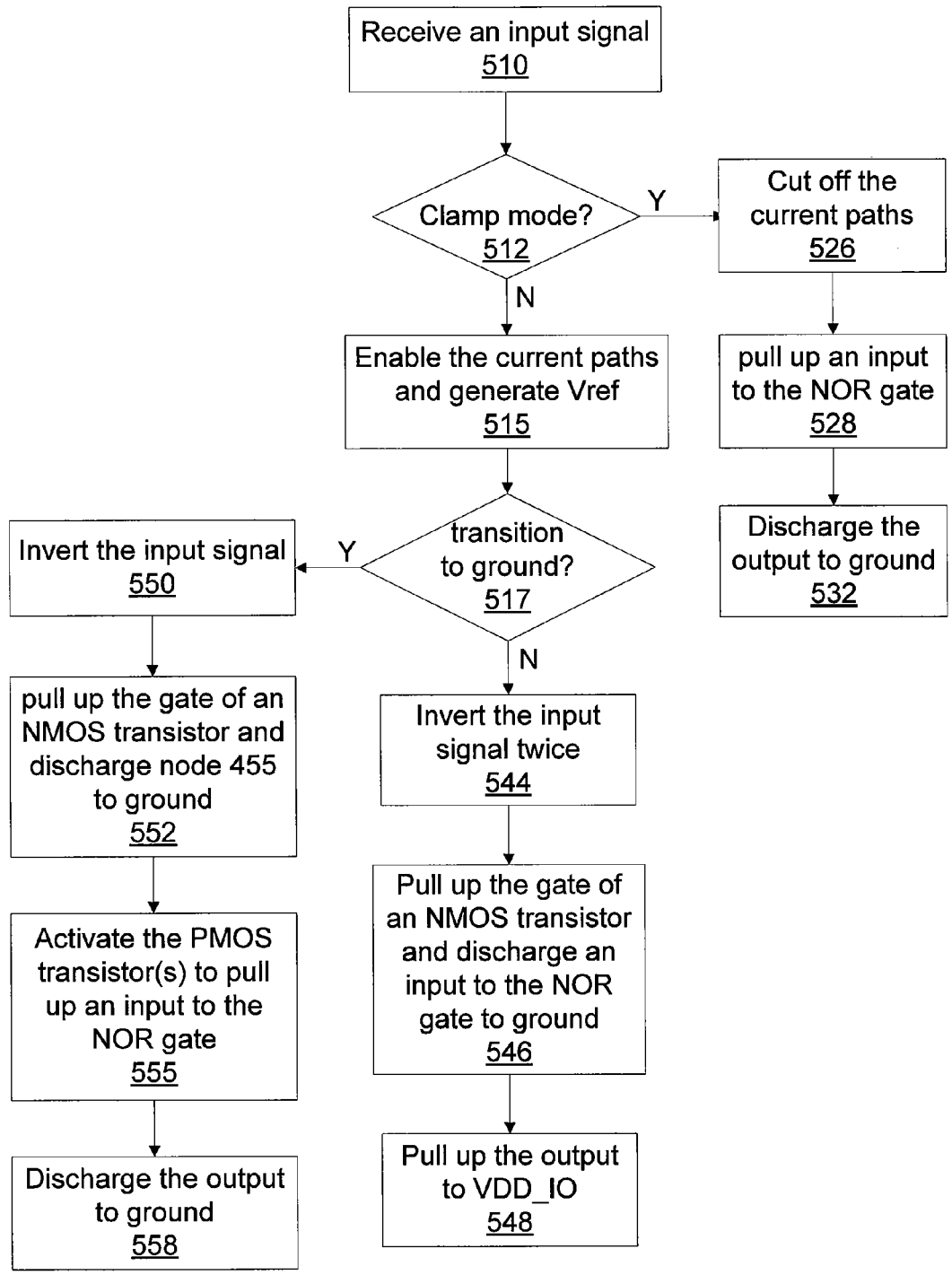
FIG. 5B is a flow diagram showing method steps for shifting a signal from a logic voltage to an input/output voltage, in accordance with one or more aspects of the present invention.

FIG. 5B is a flow diagram showing method steps for shifting a signal from a logic voltage to an input/output voltage using level shifter circuit 400, in accordance with one or more aspects of the present invention. In step 510 voltage level shifter circuit 400 receives an input signal at the input 405 or output clamp 406. The input signal will be at a ground voltage level (logical false) or at a VDD_IO voltage level (logical true). In step 512 the voltage of output clamp 406 is determined, and, when the voltage is a logical true voltage level shifter circuit 400 is configured in the clamp mode, and in step 526 all current paths between VDD_IO and ground and VDD_Logic and ground are cut off. In step 528 output clamp 406 pulls the first input to the NOR gate 432 up to VDD_IO. In step 532 the output 450 is discharged to ground.

If, in step 515 the voltage of output clamp 406 is determined to be a logical false, then the voltage level shifter circuit 400 is configured in operation mode and in step 515 the current paths between VDD_IO and ground and VDD_Logic and ground are enabled by activating transistors 402, 427, and 437 and producing Vref 407 equal to the sum of VDD_Logic and Vth_IO. In step 517 the voltage of the input 405 is determined, and, when the input 405 has transitioned from VDD_IO to ground (logical false), the input 405 is inverted by inverter 422 in step 550. In step 552 the gate of transistor 410 is pulled up to VDD_Logic and node 455 is discharged to ground since Vref 407 equals VDD_Logic+Vth_IO. In step 555 transistor 435 is activated to pull up the second input to the NOR gate 432. In step 558 the output 450 is discharged to ground (logical false).

In step 517 the voltage of the input 405 is determined, and, when the input 405 has transitioned from ground to VDD_IO (logical true), the input 405 is inverted by inverters 422 and 427 in step 544. In step 546 the gate of transistor 430 is pulled up to VDD_Logic and the second input to the NOR gate 432 is discharged to ground since Vref 407 equals VDD_Logic+ Vth_IO. In step 548 the output 450 is pulled up to VDD_IO (logical true).

System Overview

Figure 6:
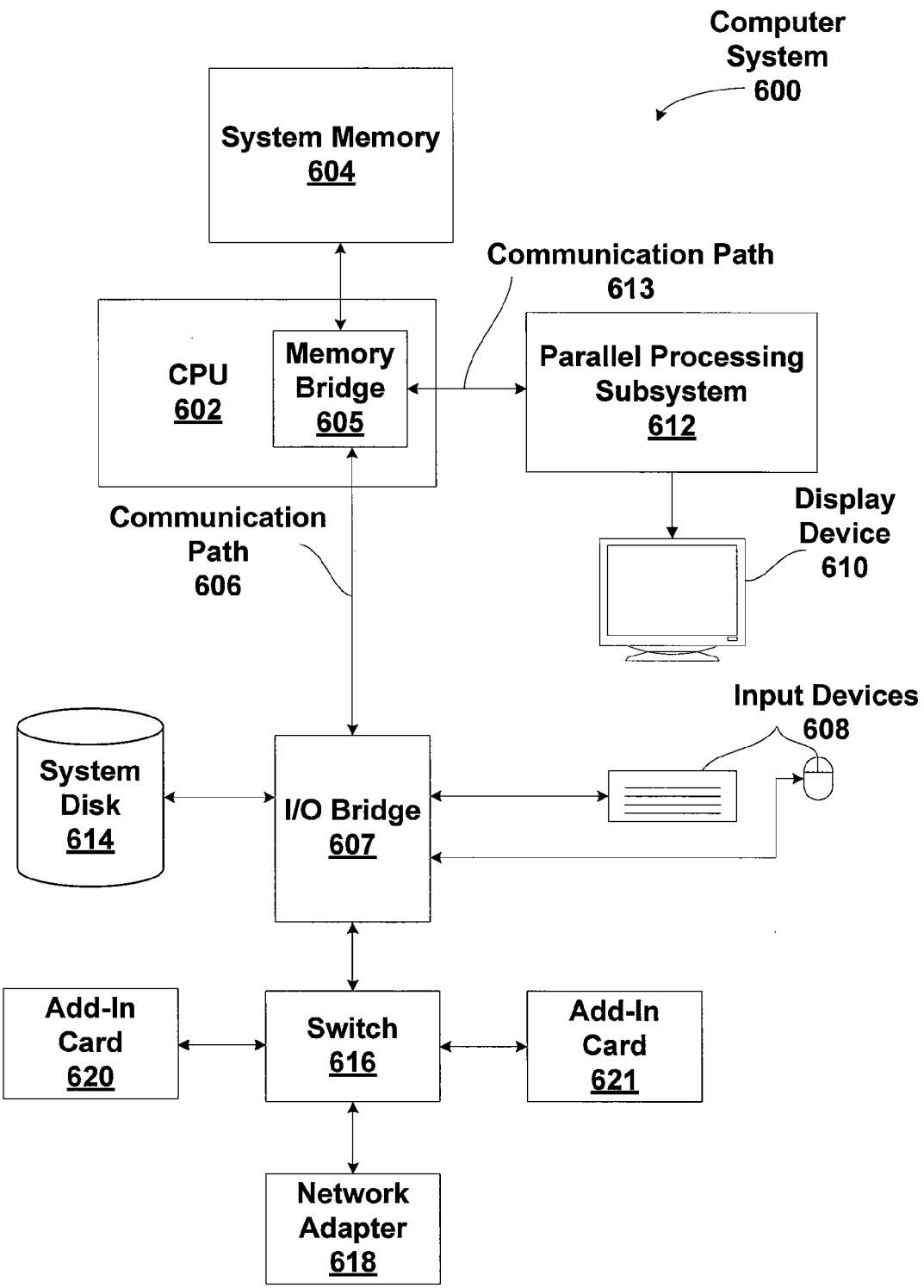
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include a voltage level shifter circuit 400.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, a technique for shifting the voltage level of signals from the low voltage (logic) domain to the high voltage (I/O) domain is disclosed, where VDD_IO is the supply voltage of the high voltage domain and VDD_Logic is the supply voltage of the low voltage domain. The voltage level shifting circuit 400 uses a combination of I/O and logic transistors to avoid exceeding a maximum tolerable voltage across the gate and source of any of the transistors. Therefore, the level shifting circuit 400 is not sensitive to scaling of VDD_logic and operates properly when VDD_logic is reduced due to shrinking silicon process technology and/or is reduced for a low power application. The voltage level shifting circuit 400 also uses a voltage reference circuit 412 that is independent of VDD_IO. These qualities allow enable fabrication of voltage level shifter circuit 400 across various silicon process technologies and for different VDD_IO and VDD_Logic values.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A voltage level shifter circuit for shifting an input signal from a low voltage domain to a high voltage domain, comprising:
a reference voltage circuit configured to use a high voltage supply from the high voltage domain and produce a reference voltage signal that is independent of the high voltage supply and ranges in value between a minimum voltage value and a maximum voltage value, the minimum voltage value equal to the sum of a low voltage supply of the low voltage domain and a threshold voltage of a transistor configured to operate in the high voltage domain and the maximum voltage value equal to the difference between the high voltage supply and the threshold voltage of the transistor configured to operate in the high voltage domain; and
a circuit configured to receive the input signal from the low voltage domain and the reference voltage signal and produce an output signal that equals the high voltage supply when the low voltage supply is applied to the input signal and equals a ground when the ground is applied to the input signal.

2. The voltage level shifter circuit of claim 1, wherein the reference voltage circuit includes:
a first PMOS transistor coupled between the high voltage supply and an output node that produces the voltage reference signal with a gate of the first PMOS transistor coupled to the output node; and
a second PMOS transistor that is coupled between the output node and the low voltage supply with a gate of the second PMOS transistor coupled to the low voltage supply.

3. The voltage level shifter circuit of claim 2, wherein a width of the first PMOS transistor is less than a width of the second PMOS transistor.

4. The voltage level shifter circuit of claim 2, wherein the voltage reference circuit includes:
a third PMOS transistor that is coupled between the high voltage supply and the first PMOS transistor with a gate coupled to an output clamp signal; and
a first NMOS transistor that is coupled between the low voltage supply and the output node with a gate of the first NMOS transistor coupled to the output clamp signal, wherein the output clamp signal is configured to clamp the output signal to the ground when the high voltage supply is applied to the output clamp signal.

5. The voltage level shifter circuit of claim 4, wherein the reference voltage signal equals the low voltage supply when the high voltage supply is applied to the output clamp signal.

6. The voltage level shifter circuit of claim 1, wherein the reference voltage signal equals the sum of the low voltage supply and the threshold voltage of the transistor configured to operate in the high voltage domain.

7. The voltage level shifter circuit of claim 1, further comprising an output clamp signal configured to clamp the output signal to the ground and cut off current paths from the high voltage supply to ground and from the low voltage supply to the ground when the high voltage supply is applied to the output clamp signal.

8. The voltage level shifter circuit of claim 1, wherein the circuit includes NMOS and PMOS transistors configured to operate in the low voltage domain that are coupled to NMOS transistors configured to operate in the high voltage domain and provide a voltage level equal to the difference between the reference voltage signal and the threshold voltage of the transistor configured to operate in the high voltage domain.

9. A method of shifting an input signal from a low voltage domain to a high voltage domain using a voltage level shifter circuit, comprising:
configuring the voltage level shifter circuit in an operation mode;
producing a reference voltage signal that is independent of a high voltage supply used by the high voltage domain and ranges in value between a minimum voltage value and a maximum voltage value, the minimum voltage value equal to the sum of a low voltage supply of the low voltage domain and a threshold voltage of a transistor configured to operate in the high voltage domain and the maximum voltage value equal to the difference between the high voltage supply and the threshold voltage of the transistor configured to operate in the high voltage domain;
receiving, at an input to the voltage level shifter circuit, the input signal at the low voltage supply from the low voltage domain; and
pulling up an output to produce a level shifted output signal at the high voltage supply.

10. The method of claim 9, further comprising the steps of:
configuring the voltage level shifter circuit in a clamp mode; and
disabling current paths between the high voltage supply and the ground voltage and the low voltage supply and the ground voltage.

11. The method of claim 10, further comprising the step of discharging the output to clamp the level shifted output signal at the ground voltage.

12. The method of claim 9, further comprising the steps of:
receiving, at the input to the voltage level shifter circuit, the input signal at a ground voltage from the low voltage domain; and
discharging the output to produce the level shifted output signal at the ground voltage.

13. An integrated circuit device, comprising:
logic circuits in a low power domain that are configured to produce logic signals ranging between a ground voltage and a low voltage supply;
input/output circuits in a high power domain that are configured to configured to receive level shifted signals ranging between a ground voltage and a high voltage supply and produce output signals ranging between a ground voltage and the high voltage supply; and
a voltage level shifter circuit that is configured to shift the logic signals from the low voltage domain to the high voltage domain to produce the level shifted signals and includes a reference voltage circuit configured to generate a reference voltage signal that is independent of the high voltage supply and ranges in value between a minimum voltage value and a maximum voltage value, the minimum voltage value equal to the sum of the low voltage supply and a threshold voltage of a transistor configured to operate in the high voltage domain and the maximum voltage value equal to the difference between the high voltage supply and the threshold voltage of the transistor configured to operate in the high voltage domain.

14. The integrated circuit device of claim 13, wherein the reference voltage circuit includes:
a first PMOS transistor coupled between the high voltage supply and an output node that produces the voltage reference signal with a gate of the first PMOS transistor coupled to the output node; and a second PMOS transistor that is coupled between the output node and the low voltage supply with a gate of the second PMOS transistor coupled to the low voltage supply.

15. The integrated circuit device of claim 14, wherein a width of the first PMOS transistor is less than a width of the second PMOS transistor.

16. The integrated circuit device of claim 14, wherein the voltage reference circuit includes:
  a third PMOS transistor that is coupled between the high voltage supply and the first PMOS transistor with a gate coupled to an output clamp signal; and
  a first NMOS transistor that is coupled between the low voltage supply and the output node with a gate of the first NMOS transistor coupled to the output clamp signal, wherein the output clamp signal is configured to clamp at least one of the level shifted signals to the ground when the high voltage supply is applied to the output clamp signal.

17. The integrated circuit device of claim 14, wherein the reference voltage signal equals the low voltage supply when the high voltage supply is applied to the output clamp signal.

18. The integrated circuit device of claim 13, wherein the reference voltage signal equals the sum of the low voltage supply and the threshold voltage of the transistor configured to operate in the high voltage domain.

19. The integrated circuit device of claim 14, wherein the voltage level shifter circuit includes NMOS and PMOS transistors configured to operate in the low voltage domain that are coupled to NMOS transistors configured to operate in the high voltage domain and provide a voltage level equal to the difference between the reference voltage signal and the threshold voltage of the transistor configured to operate in the high voltage domain.

20. The integrated circuit device of claim 13, wherein the voltage level shifter circuit is further configured to produce a level shifted signal that equals the high voltage supply when the low voltage supply is applied to the logic signal and equals a ground when the ground is applied to the logic signal.

* * * * *